United States Patent [19]
Eastep

[11] Patent Number: 6,080,499
[45] Date of Patent: Jun. 27, 2000

[54] MULTI-LAYER APPROACH FOR OPTIMIZING FERROELECTRIC FILM PERFORMANCE

[75] Inventor: Brian Lee Eastep, Colorado Springs, Colo.

[73] Assignee: Ramtron International Corporation, Colorado Springs, Colo.

[21] Appl. No.: 08/896,684

[22] Filed: Jul. 18, 1997

[51] Int. Cl.[7] ........................................................ B32B 9/00
[52] U.S. Cl. ........................ 428/701; 428/702; 427/419.2; 427/419.3
[58] Field of Search ........................... 428/426, 432, 428/701, 702; 427/419.2, 419.3

[56] References Cited

U.S. PATENT DOCUMENTS 5,188,902   2/1993   Lin ................................................ 428/426
5,397,446   3/1995   Ishihara et al. .
5,817,170  10/1998   Desu et al. ......................................... 117/2

*Primary Examiner*—Timothy M. Speer
*Attorney, Agent, or Firm*—Peter J. Meza, Esq.

[57] ABSTRACT

A multi-layer ferroelectric thin film includes a nucleation layer, a bulk layer, and an optional cap layer. A thin nucleation layer of a specific composition is implemented on a bottom electrode to optimize ferroelectric crystal orientation and is markedly different from the composition required in the bulk of a ferroelectric film. The bulk film utilizes the established nucleation layer as a foundation for its crystalline growth. A multi-step deposition process is implemented to achieve a desired composition profile. This method also allows for an optional third composition adjustment near the upper surface of the film to ensure compatibility with an upper electrode interface and to compensate for interactions resulting from subsequent processing.

20 Claims, 1 Drawing Sheet

_(US 6,080,499)_

MULTI-LAYER APPROACH FOR OPTIMIZING FERROELECTRIC FILM PERFORMANCE

BACKGROUND OF THE INVENTION

This invention relates generally to ferroelectric films. More particularly, the present invention relates to a ferroelectric film having improved electrical characteristics and the corresponding fabrication method for producing the ferroelectric film.

Ferroelectric films are typically used as the dielectric material for a ferroelectric capacitor in a ferroelectric memory cell. For proper memory operation, it is critical that the ferroelectric film achieves desirable electrical performance evidenced by the ability to liberate a detectable charge in response to the application of an externally applied electrical field. It has been shown in the laboratory that crystal growth characteristics and film orientation are critical to achieving this desirable electrical performance. Typically, the ferroelectric film is deposited on a conducting electrode surface, such as the bottom electrode of the ferroelectric capacitor. The bottom electrode can be fabricated from a variety of films such as: platinum, iridium, iridium oxide, ruthenium oxide, palladium, as well as other noble metals and their oxides, or other suitable conductive materials known in the art. Each of these electrodes has a unique surface with changing roughness, and/or conductivity, which dramatically impacts the sticking coefficients for the various components of a subsequently deposited ferroelectric film. As the sticking coefficients vary, the composition of the ferroelectric film varies. As the electrode surface begins to accept a layer of ferroelectric film, the sticking coefficients for the constituents change and dictate the composition of the bulk film. Therefore, the composition required for optimum electrical performance cannot be obtained using a single fixed set of sputtering conditions or solution chemistry.

For subsequent comparison to the improved ferroelectric film of the present invention, a typical prior art ferroelectric PZT film (lead zirconate titanate) having a thickness of about 2400 Angstroms and deposited with a single step deposition has roughly 75% of the crystal domains oriented in the <111> crystal orientation. The "switched charge" liberated using a three-volt pulse ["Qsw(3v)"] was measured at about 21 micro-Coulombs per centimeter squared. The applied voltage at which the switched charge of the ferroelectric capacitor is 90% saturated ["V(90%)"] was measured at about 4.5 volts.

What is desired is a ferroelectric film having optimized electrical performance in which specific adjustments in deposition conditions are made to compensate for the electrode variables described above and to dictate a desired film composition profile.

SUMMARY OF THE INVENTION

It is, therefore, a principal object of the present invention to achieve an optimized composition profile in a ferroelectric film in order to enhance electrical performance.

According to the present invention a thin nucleation layer of a specific composition is implemented to optimize ferroelectric crystal orientation and is markedly different from the composition required in the bulk of the ferroelectric film. The bulk film utilizes the established nucleation layer as a foundation for its crystalline growth. Because of these composition requirements, a multi-step deposition process is implemented to achieve the desired composition profile. The method of the present invention also allows for an optional third composition adjustment near the upper surface of the film to ensure compatibility with an upper electrode interface and to compensate for interactions resulting from subsequent processing.

The foregoing and other objects, features and advantages of the invention will become more readily apparent from the following detailed description of a preferred embodiment of the invention, which proceeds with reference to the accompanying drawing FIGURE.

BRIEF DESCIRIPTION OF THE DRAWINGS

The SOLE DRAWING FIGURE is a cross-sectional diagram of a multilayer ferroelectric film in a ferroelectric capacitor manufactured according to the method of the present invention.

DETAILED DESCRIPTION

Figure 1:
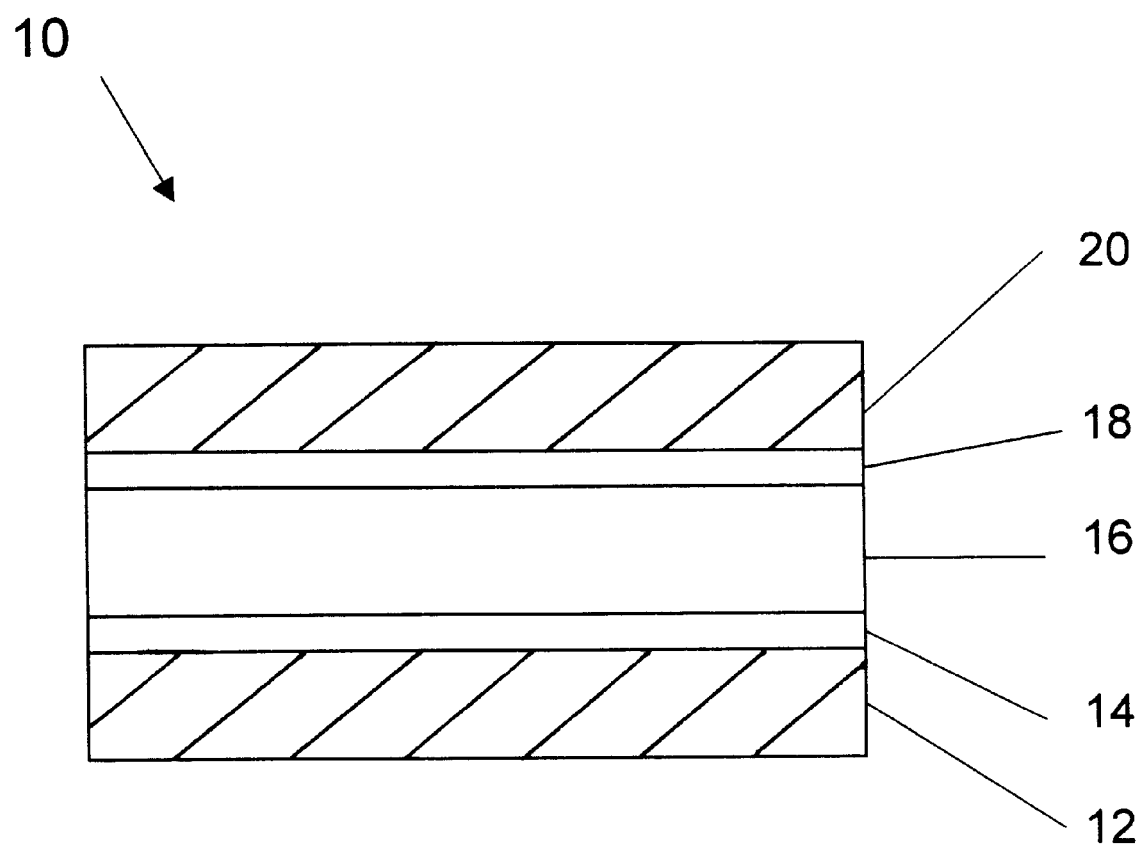

Referring now to the SOLE DRAWING FIGURE, a ferroelectric capacitor 10 is shown having a bottom electrode 12, an upper electrode 20, a thin nucleation layer 14, a bulk ferroelectric layer 16, and an optional third or "cap" ferroelectric layer 18. Ferroelectric capacitor 10 can be used as the storage element in a ferroelectric memory cell, which resides in an array of such ferroelectric memory cells.

PZT Sputter Deposition on a Platinum Bottom Electrode Using a Single Target

For optimized electrical performance, the PZT ferroelectric film manufactured according to the present invention is sputter deposited from a single target with a lead-rich ("Pb") nucleation layer 14, followed by a subsequently sputter deposited "lesser" lead-rich bulk layer 16. In order to achieve optimum electrical performance using a single target deposition, the multi-layer approach of the present invention is highly desirable. To achieve a lead-rich nucleation layer 14, high pressure and low power are employed to deposit a film of 50 to 500 Angstroms thick with excess lead of 25 to 35%. After deposition of the nucleation layer 14, the sputter conditions are changed to reduce the lead content for the bulk film layer 16 (10 to 20% excess lead) by lowering pressure and raising power. These combinations of lead in the nucleation layer 14 and bulk layer 16 are critical to ensure proper nucleation and film growth through the subsequent high temperature anneals required to form the desired crystal structure. In these anneals the volatility of lead plays a key role. The high concentrations of lead in the nucleation layer 14 are critical for ensuring an adequate lead supply for crystal formation while maintaining an escape route for the excess lead (i.e. the lower lead bulk layer 16). If the amount of lead in the bulk layer 16 is too excessive it will overwhelm the nucleation layer 14 and disrupt nucleation and crystal growth. If the bulk layer 16 is too lead-deficient, it consumes needed lead from the nucleation layer 14 and again disrupts crystal growth.

In some cases, a lead-rich cap layer 18 is desirable to buffer film degradation during subsequent CMOS processing. If used, the cap layer 18 is ideally sufficiently removed from the nucleation layer 14 to ensure that it does not influence crystal growth. The cap layer 18 is optimized for thickness and lead content to ensure compatibility with top electrode 20. If desired, a multi-layer bottom electrode 12 consisting of platinum and iridium, and a multi-layer top electrode 20 consisting of platinum and iridium oxide can be used. Other layers, such as titanium adhesion layers, can also be used. While platinum is a preferred electrode material, other appropriate electrode materials known in the art can be used as described in the Background of the Invention.

Sputtering Conditions

In the preferred embodiment, the target composition of the PZT sputtering target is as follows: 1.035 lead, 0.400 zirconium, 0.600 titanium, 0.030 lanthanum, 0.050 calcium, and 0.020 strontium. The bottom electrode 12 and top electrode 20 are platinum, each about 1750 Angstroms thick.

It should be noted that the exact sputtering conditions identified below are specific to a given sputtering tool. It is appreciated by those skilled in the art that the exact sputtering conditions will be modified as necessary to accommodate other sputtering tools.

In the preferred embodiment, a Gryphon Sputtering Deposition Tool is used. All layers 14, 16, and 18 are deposited at the same temperature (Room Temperature) and in the same sputter ambient environment (Argon). The sputter conditions for the nucleation layer 14 are 750 watts at an 18 mTorr pressure to produce a film between 50 and 100 Angstroms thick with approximately 30% excess lead. The bulk layer 16 is deposited at 1000 watts at a 2 mTorr pressure to build up the remaining film thickness with an excess lead content of about 15–20%. If an optional cap layer 18 is employed to enhance the top electrode 20 interface characteristics, the bulk layer 16 thickness is reduced by the additional thickness of the cap layer 18. The cap layer 18 is between 200 and 300 Angstroms thick and varies between 25 and 35% excess lead. The sputter conditions for producing the cap layer 18 lead contents are 750 watts at a 10 mTorr pressure for 25% excess lead and 550 watts at an 18 mTorr pressure for 35% excess lead.

Electrical Performance Improvement

A bi-layer ferroelectric film consisting of layers 14 and 16 has a crystal orientation of near 98% of the crystal domains oriented in the <111> orientation, with Qsw(3V) switched charge measured at three volts of about 30 micro-Coulombs per centimeter squared. A V(90%) was measured at about 3.5 volts. Both measurements indicate significant improvement in electrical characteristics over the single-layer ferroelectric film referenced in the Background of the Invention.

PZT Sputter Deposition on a Platinum Bottom Electrode Using Multiple Targets

The multiple layer sputter deposition technique described above can also be implemented using a "cluster tool" with a minimum of two chambers, each containing a sputtering target. In the cluster tool, a first chamber contains a target with higher lead content. The wafer on which the capacitors are built is transferred to the first chamber and the nucleation layer 14 is deposited with, for example, 30% excess lead. After depositing the nucleation layer 14, the wafer is transferred to a second chamber with an alternative target composition. The bulk layer 16 is subsequently deposited in the second chamber with, for example, 15–20% excess lead. An additional third chamber and target, or the first chamber and target, can be used to deposit the cap layer 18, if desired.

Solution Chemistry or CVD ("Chemical Vapor Deposition")

In general, the same principles of composition control, for specific regions of the ferroelectric film, apply to both solution chemistry and CVD techniques. In both cases, a composition change is required for each of the layers. For example, in solution chemistry for the PZT example above, solutions with three different lead contents and potentially varying viscosities (or, at a minimum, different spin speeds) are required to achieve the desired film compositions and thickness targets. For CVD, the flow rates for the critical precursors are ideally changed for each of the layers. In all cases, whether the film is crystallized in situ or in a separate anneal step, controlling the composition of the nucleation layer 14 independent of the bulk layer 16 is critical in establishing optimum crystal growth and orientation for ferroelectric electrical performance.

Other Ferroelectric Materials

The techniques described herein can also be easily applied to other types of ferroelectric materials. One material that may have promise as a suitable ferroelectric material is strontium bismuth tantalate ("SBT"). The volatile component, or "A" site Perovskite lattice constituent is bismuth, which, similarly to lead in the PZT ferroelectric film, plays a critical role in electrical performance and the orientation of the film. The multi-layer approach taught herein is anticipated to provide the same potential benefits regarding an improvement in electrical performance. A bismuth-rich nucleation layer 14 is used, followed by a relatively bismuth-poor bulk layer 16. If desired, an optional cap layer 18 can be used as in the previous examples.

Having described and illustrated the principle of the invention in a preferred embodiment thereof, it is appreciated by those having skill in the art that the invention can be modified in arrangement and detail without departing from such principles. I therefore claim all modifications and variations coming within the spirit and scope of the following claims.

I claim:

1. An improved ferroelectric thin film comprising:
   a first PZT layer including a first percentage of excess lead;
   a second PZT layer including a second percentage of excess lead, in which the first percentage is greater than the second percentage.

2. A ferroelectric thin film as in claim 1 in which the first PZT layer comprises a PZT layer about 50 to 500 Angstroms thick.

3. A ferroelectric thin film as in claim 1 in which the first PZT layer comprises a PZT layer including about 25–35% excess lead.

4. A ferroelectric thin film as in claim 1 in which the second PZT layer comprises a PZT layer about 1000 to 4000 Angstroms thick.

5. A ferroelectric thin film as in claim 1 in which the second PZT layer comprises a PZT layer including about 15–20% excess lead.

6. A ferroelectric thin film as in claim 1 further comprising an optional third PZT layer.

7. A ferroelectric thin film as in claim 6 in which the third PZT layer comprises a PZT layer about 200 to 300 Angstroms thick.

8. A ferroelectric thin film as in claim 6 in which the third PZT layer comprises a PZT layer including about 25–35% excess lead.

9. A ferroelectric thin film as in claim 1 having a $Q_{SW}$ of about 30 micro-Coulombs of switched charge per square centimeter.

10. A ferroelectric thin film as in claim 1 having a V(90%) of about 3.5 volts.

11. A method of fabricating a ferroelectric thin film comprising:
    forming a first PZT layer including a first percentage of excess lead;
    forming a second PZT layer including a second percentage of excess lead, in which the first percentage is greater than the second percentage.

12. The method of claim 11 in which the step of forming the first PZT layer comprises the step of forming a PZT layer about 50 to 500 Angstroms thick.

13. The method of claim 11 in which the step of forming the first PZT layer comprises the step of forming a PZT layer including about 25–35% excess lead.

14. The method of claim 11 in which the step of forming the second PZT layer comprises the step of forming a PZT layer about 1000 to 4000 Angstroms thick.

15. The method of claim 11 in which the step of forming the second PZT layer comprises the step of forming a PZT layer including about 15–20% excess lead.

16. The method of claim 11 further comprising the step of forming an optional third PZT layer.

17. The method of claim 16 in which the step of forming the third PZT layer comprises the step of forming a PZT layer about 200 to 300 Angstroms thick.

18. The method of claim 16 in which the step of forming the third PZT layer comprises the step of forming a PZT layer including about 25–35% excess lead.

19. An improved ferroelectric thin film in which the nucleation layer and the bulk layer each comprise a layer of PZT, wherein the nucleation layer includes greater excess lead than the bulk layer.

20. An improved ferroelectric thin film in which the nucleation layer and the bulk layer each comprise a layer of SBT, wherein the nucleation layer includes greater excess bismuth than the bulk layer.

\* \* \* \* \*